(12) United States Patent
Klein

(10) Patent No.: US 6,208,515 B1
(45) Date of Patent: Mar. 27, 2001

(54) SOCKET FOR AN INTEGRATED CIRCUIT

(75) Inventor: Klaus Klein, Rheinstetten (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/308,904

(22) PCT Filed: Nov. 25, 1997

(86) PCT No.: PCT/DE97/02756

§ 371 Date: Oct. 13, 1999

§ 102(e) Date: Oct. 13, 1999

(87) PCT Pub. No.: WO98/24283

PCT Pub. Date: Jun. 4, 1998

(30) Foreign Application Priority Data

Nov. 26, 1996 (DE) .............................. 296 20 596

(51) Int. Cl.⁷ ................ H05K 7/20; H05K 9/00
(52) U.S. Cl. ............ 361/704; 174/35 R; 361/816; 439/570; 439/607
(58) Field of Search .................. 174/35 R, 35 G, 174/51; 361/707, 709–715, 783, 785, 816, 818; 439/570, 607, 70, 71, 73

(56) References Cited

U.S. PATENT DOCUMENTS

| | | |
|---|---|---|
| 4,433,886 * | 2/1984 | Cassarly et al. ............ 439/607 |
| 4,906,194 | 3/1990 | Grabbe . |
| 5,058,265 | 10/1991 | Goldfarb . |
| 5,241,453 | 8/1993 | Bright et al. . |
| 5,302,853 | 4/1994 | Volz et al. . |
| 5,357,404 | 10/1994 | Bright et al. . |
| 5,473,510 | 12/1995 | Dozier, II . |

FOREIGN PATENT DOCUMENTS

| | | |
|---|---|---|
| 29 19 058 | 11/1980 | (DE) . |
| 34 39 556 | 2/1986 | (DE) . |
| 36 29 567 | 3/1988 | (DE) . |
| 87 16 007 | 1/1989 | (DE) . |
| 39 22 461 | 1/1990 | (DE) . |
| 43 26 207 | 4/1994 | (DE) . |
| 43 10 446 | 5/1994 | (DE) . |
| 44 10 467 | 1/1995 | (DE) . |
| 195 11 229 | 10/1995 | (DE) . |
| 0 376 659 | 7/1990 | (EP) . |
| 0 632 538 | 1/1995 | (EP) . |
| 2 272 580 | 5/1994 | (GB) . |
| WO 89/10014 | 10/1989 | (WO) . |

* cited by examiner

Primary Examiner—Gregory Thompson
(74) Attorney, Agent, or Firm—Kenyon & Kenyon

(57) ABSTRACT

A socket for an integrated circuit has a shielding housing that is open on one side facing the circuit board, with a frame and a cover to accommodate the integrated circuit and a socket insert, with the cover being openable to remove the integrated circuit. For better heat dissipation, the cover may be designed as a heat sink provided with cooling ribs and optionally supplemented by a heat sink on the opposite side of the circuit board.

10 Claims, 4 Drawing Sheets

FIG 6
FIG 7
FIG 8
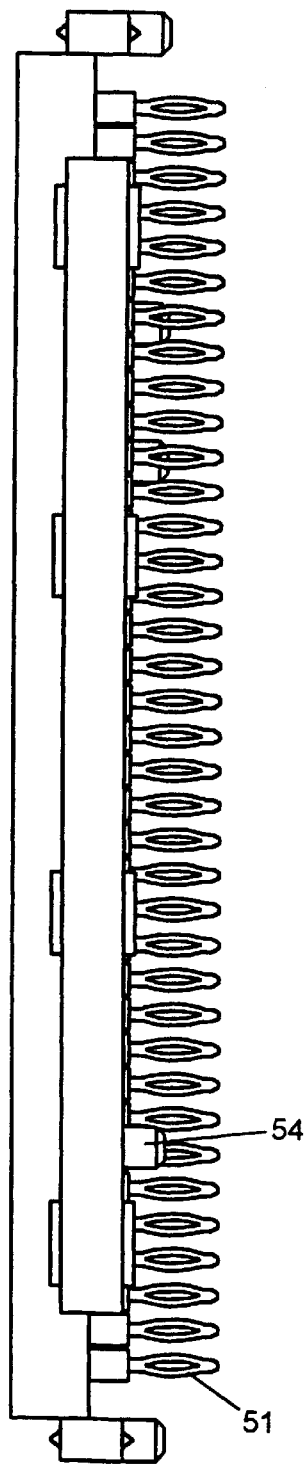
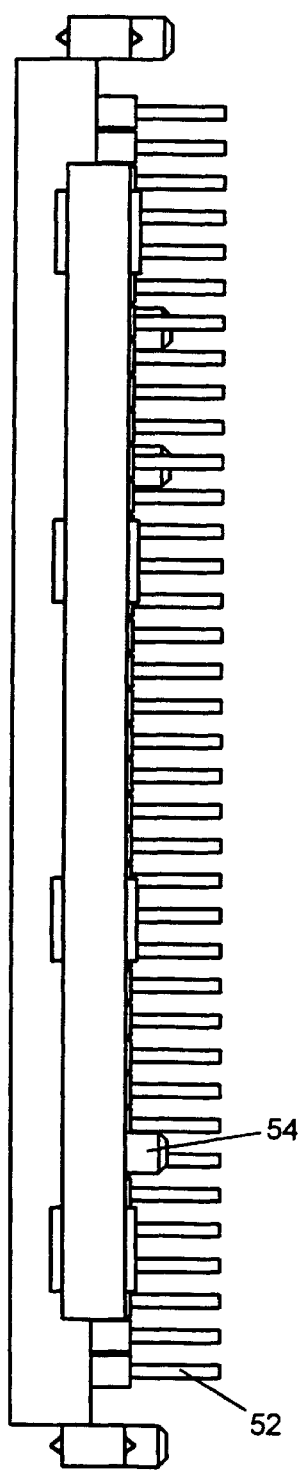
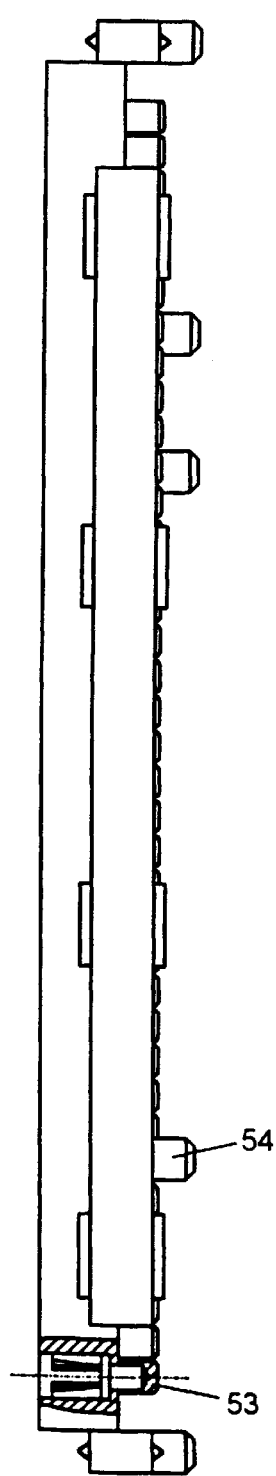

SOCKET FOR AN INTEGRATED CIRCUIT

FIELD OF THE INVENTION

The present invention relates to a socket for an integrated circuit.

BACKGROUND INFORMATION

Highly complicated and cost-intensive integrated circuits such as processors are available as components in standardized multipolar housings, such as pin grid array (PGA) or staggered pin grid array (SPGA). For assembly on a circuit board, terminal elements of the integrated circuit, known as pins, are optionally joined directly to terminal elements of the circuit board by soldering, or the integrated circuit is detachably inserted into a socket which is itself soldered onto the circuit board and the electric connections are established between the terminal elements of the integrated circuit and the terminal elements of the circuit board. The greater expense in using a socket as an additional component yields the advantage that it is easy to later replace the integrated circuit, e.g., for repair or for upgrading with a more effective component. With a directly soldered integrated circuit, this would be impossible or could only be done at great expense.

German Utility Patent No. 87 16 007 describes such a socket which is also equipped with a heat sink which is snapped into a carrying frame for cooling purposes. It does not describe any special measures for electromagnetic or electrostatic shielding of the integrated circuit.

German Patent No. 39 22 461 C2 describes a shielding housing which can be used to accommodate various circuits. This housing is essentially cuboid-shaped and has one open side which is closed by the circuit board when the latter is mounted on it. The shielding housing is mounted on the circuit board by inserting four mounting legs provided on the lower edge of the shielding housing in mounting holes on the circuit board and bending them over or soldering them. Circuits accommodated in the shielding housing are soldered directly to the circuit board. This shielding housing disadvantageously makes replacement of components even more difficult. Another disadvantage is that the encapsulation of components has a negative effect on heat dissipation, which must be guaranteed with complex integrated circuits in particular.

SUMMARY

An object of the present invention is to create a socket for an integrated circuit that will permit easy replacement of installed integrated circuits despite the good electromagnetic shielding.

An advantage of the socket according to the present invention is that the integrated circuit is accessible after opening the housing cover and can be removed from a socket insert—optionally with the assistance of a simple lifting tool. For easy opening of the cover, it may be attached using screws, clamps or a snap connection, for example. The electric terminal technique of the socket insert can be designed as with traditional terminal forms and is not subject to any additional restrictions. Thus, for example, terminal elements may be designed using plug-in technology on the side of the integrated circuit, and on the circuit board side the terminal elements may be designed in ball grid array (BGA) or stud grid array (SGA). In particular when surface mounted device (SMD) technology is used on the circuit board side, it is advantageous to secure the socket insert in its position using the socket frame which is mounted on the circuit board. This prevents the extraction forces which occur in removing the integrated circuit from acting on the electric contact points on the socket insert, thereby damaging them. Even during assembly of the socket insert by the press-fit technique, the press-fit pins should not be subjected to an excessively high pulling force. Easy accessibility of the integrated circuit for a lifting tool can be achieved by a chamfer on the inside of the socket frame. If a screwdriver, for example, is used as the lifting tool, the socket frame serves as a bearing abutment with a good lever action close to the component in an advantageous manner. In addition, the socket frame is designed to permit the use of a special lifting tool that can also be used for pushing in the component. Due to the fact that the socket frame is composed of multiple parts, different types of frames can also be assembled advantageously according to a modular principle. This does not have a negative effect on the shielding properties of the housing with regard to electromagnetic or electrostatic influences if the parts overlap at the points of contact. For better heat dissipation, the cover and frame of the socket may also be designed as heat sinks with cooling ribs. For good thermal contact between the cover and the integrated circuit, the cover sits in a form-fitting manner on the top of the integrated circuit, optionally with thermal coupling by means of a heat transfer paste. It is also advantageous to use a heat transfer paste between the cover and the frame. The active surface area in heat dissipation can be further enlarged by mounting a bottom plate on the opposite side of the circuit board and coupling it thermally to the frame and cover of the housing. The heat transfer and the ground connection can also be improved through additional modifications of the circuit board, such as large-area copper surfaces on both sides, joined together with the largest possible number of plated-through holes. A recess provided in the bottom plate can ensure to advantage that terminal elements projecting through the circuit board are not short-circuited. Such a bottom plate may also serve as a bearing abutment in mounting a socket insert with press-fit contacts. With a BGA or SGA design of the socket insert, the bottom plate is preferably flat, i.e, there are no recesses, for better dissipation of heat and to serve as a bearing abutment. Use of SMD technology on the circuit board side also has the advantage that integrated circuits with PGA or SPGA terminal forms which are actually designed for plug-in assembly can be assembled on a circuit board using pure SMD (surface mounted device) technology without having to break through the SMD principle. With this socket, integrated circuits with PGA or SPGA terminal forms that are actually designed for a plug-in assembly can also be assembled with on a circuit board in pure SMD (surface mounted device) technology without having to violate the SMD principle. Integrated circuits for plug-in assembly can also be assembled with circuit board technologies that do not allow through-plated contacts as terminal elements. For example, this is the case with circuit boards with multiple surface wiring, where the number of signal layers is drastically reduced by partial through-plated contacts for connecting conductors on different layers. Due to the fact that it is now possible to use pure SMD technology, this eliminates the steps that would be necessary in a mixed technique for assembling and soldering components in plug-in assembly. In other words, a subassembly need no longer be guided to a manual assembly site and over a flow solder bath in the manufacturing operation. This greatly reduces manufacturing costs.

BRIEF DESCRIPTION OF THE DRAWINGS

FIG. 6 shows a socket insert with terminal elements for press-fit technique in accordance with an example embodiment of the present invention.

FIG. 7 shows a socket insert for plug-in assembly in soldering technology according to an example embodiment of the present invention.

FIG. 8 shows a socket insert in SGA design according to an example embodiment of the present invention.

DETAILED DESCRIPTION

The same parts are labeled with the same reference numbers.

Figure 1:
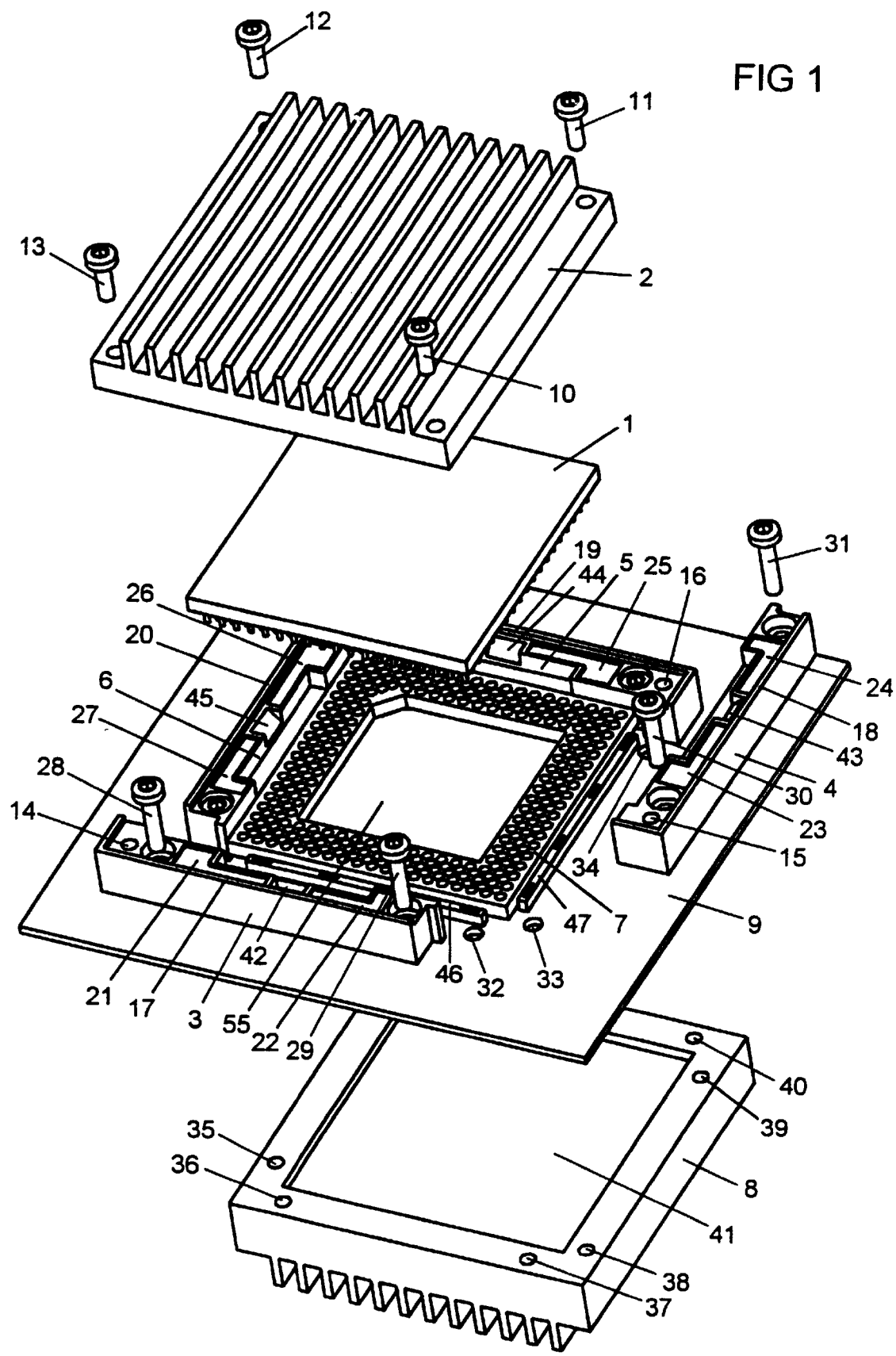
FIG. 1 shows an exploded diagram of a socket according to an example embodiment of the present invention.

As shown in FIG. 1, a socket for an integrated circuit 1 is includes a cover 2, a frame, shown here as having four parts 3, 4, 5 and 6, a socket insert 7 and a bottom 8. Cover 2 is designed as a heat sink and is provided with cooling ribs on its top, so that it can be aligned optimally with regard to the air flow in the apparatus in which circuit board 9 assembled with the parts shown here is to be installed. The cover is mounted on the socket frame with four screws 10–13 arranged in the area of the corners. Orifices with an inside thread (only orifices 14, 15 and 16 are visible in FIG. 2) corresponding to screws 10–13 are provided in parts 3–6 of the socket frame. For the shielding housing to also be radiation tight at the points of contact between cover 2 and the socket frame, parts 3–6 each have a collar 17, 18, 19, 20 projecting slightly beyond cover 2 at the sides of the respective edge sections. For economic reasons, the socket frame may also be designed as a one-piece frame with fewer fastening points on the circuit board. In the assembled state, cover 2 lies flat on the top of integrated circuit 1. This yields a good thermal coupling between integrated circuit 1 and cover 2. To further improve the thermal coupling, the top of integrated circuit 1 may be provided at the time of assembly with a heat transfer paste or a similar agent such as a heat transfer film. To also permit good thermal coupling between the socket frame and cover 2, two recesses are provided in each part 3–6, serving as a reservoir for heat transfer paste. Of these, only recesses 21–27 are visible in FIG. 1. Parts 3–6 of the socket frame are provided with overlaps at the points of contact, so that no electromagnetic or electrostatic radiation can penetrate through these points of contact into the shielding housing. The socket frame is mounted with eight screws passing through orifices in the circuit board and screwed into corresponding holes having an inside thread in bottom 8. FIG. 1 shows only screws 28–31, orifices 32, 33 and 34 and holes 35–40. Bottom 8 is also designed as a heat sink and is provided with cooling ribs. Bottom 8 has a recess 41 into which any projecting terminal elements of socket insert 7 on the underside of circuit board 9 can project without touching bottom 8. Bottom 8 may also be used as a support or bearing abutment when a socket insert 7 with insertion pins or with contact elements clamped in their guides by pressing socket insert 7 against circuit board 9 is used. If the thermal coupling between bottom 8 and the socket frame provided by the eight mounting screws and the contact points on circuit board 9 is not sufficient, additional recesses (not shown in FIG. 1) may be provided as a reservoir for heat transfer paste on the top of the edges of bottom 8 as well as on the lower side of parts 3–6 of the socket frame. Since heat sinks are provided on both sides of circuit board 9, the total height of the socket is more or less distributed on both sides of circuit board 9. Thus, only a small height above circuit board 9 is needed on each side to implement the dissipation of heat from integrated circuit 1. In certain cases, this may be of crucial importance, e.g., when only a small height is allowed on the component side of circuit board 9, but that would not be sufficient for dissipating heat with only one heat sink on the component side operating without a fan. For easy removability of integrated circuit 1, e.g., for repairs or for upgrading the electronic apparatus, chamfered recesses 42, 43, 44 and 45 are provided on parts 3–6; a lifting tool such as a screwdriver blade can be inserted into these recesses in such a way as to grip behind the lower side of integrated circuit 1. At the same time, parts 3–6 may serve as a bearing abutment to produce a lever effect. To secure the position of socket insert 7, i.e., so that it is not released from circuit board 9 when integrated circuit 1 is extracted, ridges (which are covered in FIG. 1) are provided on parts 3–6 of the socket frame, coming to lie on the edges (only edges 46 and 47 are visible in FIG. 1) which almost completely surround socket insert 7 when assembled.

Figure 2:
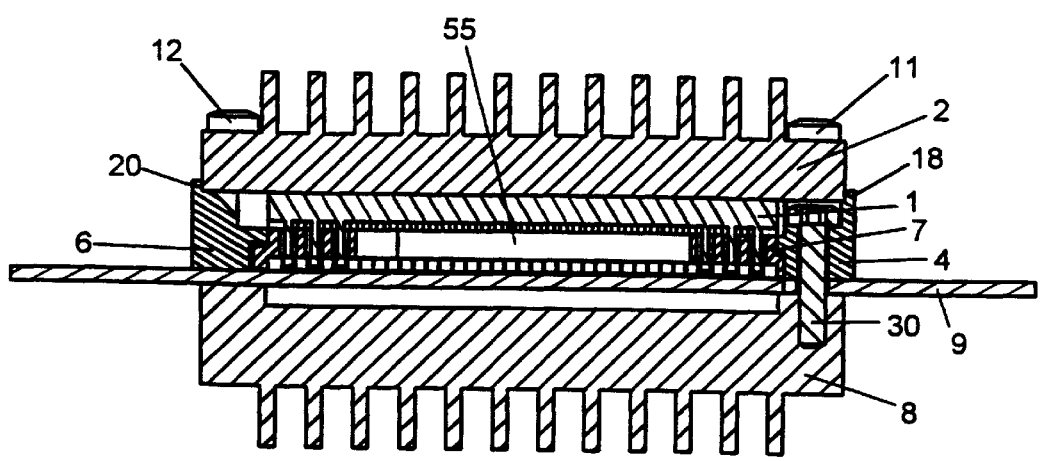
FIG. 2 shows a sectional diagram through a socket according to an example embodiment of the present invention.

FIG. 2 shows a section through an assembled socket according to FIG. 1, illustrating especially well the overlapping of collars 18 and 20 by parts 4 and 6 of the socket frame on the sides of cover 2 as described above. The distribution of the total height of the socket on both sides of circuit board 9 is also visible, yielding a low height on the upper and lower sides with good dissipation of heat from integrated circuit 1. The socket design may be tied into the ground concept, i.e., the arrangement of the shielding and the reference ground in the electronic apparatus, using contact points placed in the area of the socket frame on circuit board 9.

Figure 3:
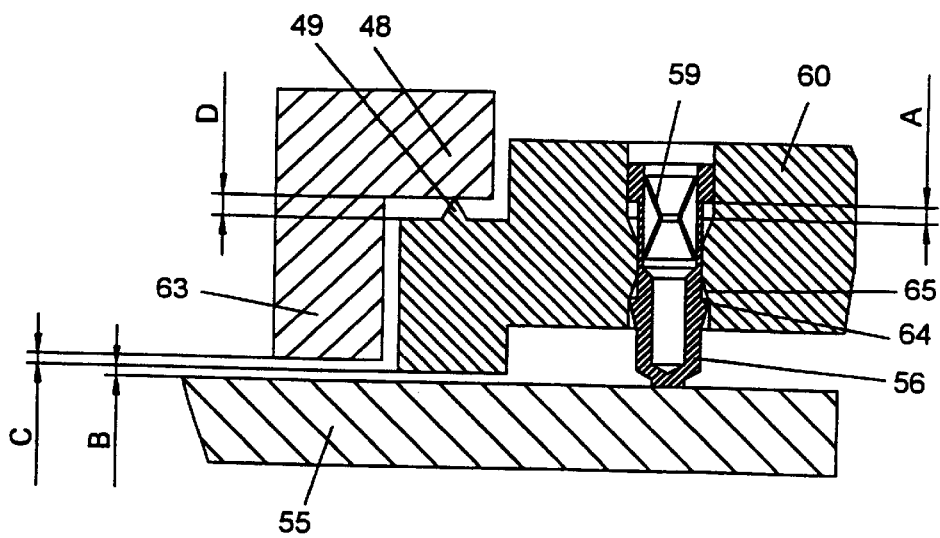
FIG. 3 shows a sectional diagram of a socket insert with frictionally engaged clamping of a contact element according to an example embodiment of the present invention.
Figure 4:
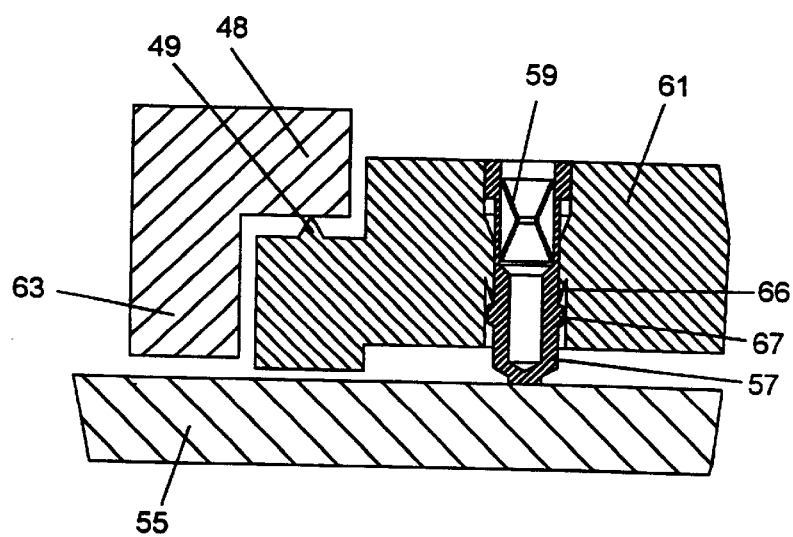
FIG. 4 shows a socket insert with a form-fitting clamping according to an example embodiment of the present invention.
Figure 5:
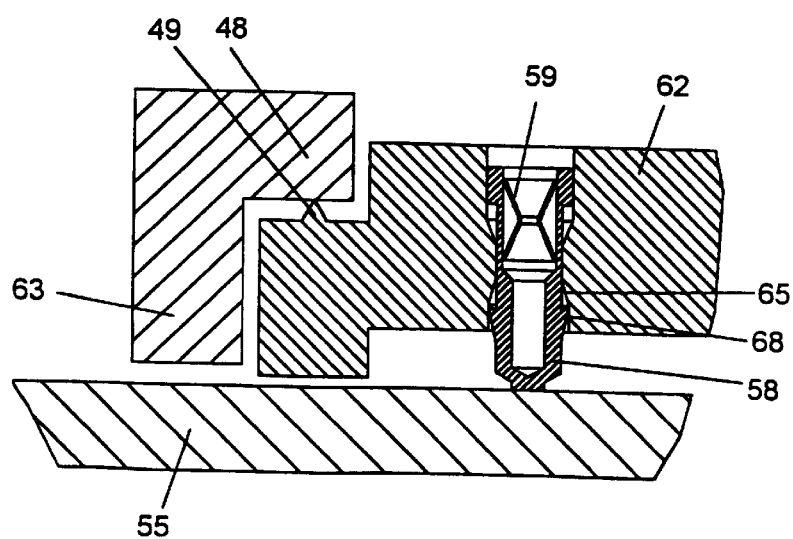
FIG. 5 shows a socket insert with frictionally engaged and form-fitting clamping according to an example embodiment of the present invention.

FIGS. 3, 4 and 5 illustrate different variants for clamping a contact element in the socket insert after pressing onto a circuit board 55. The situation immediately before pressing is shown here. Contact elements 56, 57 and 58 are each provided with a contact spring 59 for contacting the terminal element of an integrated circuit to be installed. Contact elements 56, 57 and 58 are inserted from above into a plastic body 60, 61 or 62 and are secured in their end position by a snap connection to prevent them from falling out. Plastic bodies 60, 61 and 62 are pressed onto circuit board 55 and secured there with a frame 63 which can be attached directly to the circuit board. To illustrate the tolerance compensation, FIG. 3 shows dimensions A, B, C and D. In all three clamping variants, contact elements 56, 57 and 58 are displaceable in their guides by distance A to be able to compensate for tolerances in height of the terminal elements on circuit board 55. Dimension B determines the distance by which contact elements 56, 57 and 58 are displaced out of their end position in plastic body 60, 61 or 62 when the socket inserts are pressed against circuit board 55 to create a clamping action in the guide. To secure the position of the socket insert in the socket, a ridge 48 is provided on frame 63, the lower side of ridge 48 in contact with the upper side of one edge of plastic body 60, 61 or 62 of the socket inserts. To compensate for manufacturing tolerances and to produce a defined pressing force, roof-shaped projections 49 pointing upward are provided on the upper side of the edge of plastic bodies 60, 61 and 62. When the socket inserts are pressed against circuit board 55, height D of projections is reduced by the amount C to compensate for the tolerance due to deformation of the projections. In the variant according to FIG. 3, a frictionally engaged clamping of contact element 56 in plastic body 60 is achieved by a peripheral collar 64 of contact element 56 being pressed into a conical chamfer 65 of plastic body 60, being held there by a mutual clamping. A form-fitting clamping effect is obtained with the variant according to FIG. 4, where a collar 66 which is initially in the form of a hollow cone is in contact with the shaft of contact element 57 and is deformed by a peripheral collar 67 of contact element 57 when pressed against circuit board 55. This produces a form-fitting connection with collar 67 in plastic part 61. In the third variant illustrated in FIG. 5, contact element 58 is provided with a peripheral deformable pointed collar 68 which is pressed into plastic part 62 and produces a form-fitting and frictionally engaged clamping effect. It is thus ensured with all three variants illustrated in FIGS. 3, 4, and 5 that no forces will act on the soldered connections on circuit board 55 when an integrated circuit 1, which may be designed as a PGA or SPGA component, is extracted.

A socket insert for plug-in assembly shown in FIG. 6 has insertion pins 51 with spring elements in their shaft area which press against the inside of the hole when pressed into a metallized, plated-through hole in a circuit board. No solder joint is required here. However, with a socket for plug-in assembly according to FIG. 7, terminal pins 52 projecting through the metal-plated orifices in the circuit board are electrically connected to printed conductors of the circuit board by soldering. Terminal elements 53 of the socket insert shown in FIG. 8 are also soldered to terminal faces on the surface of the circuit board, which are only provided on the surface of the circuit board here. With the surface mount technology (SMT) used here, it is advantageous if the socket insert is accurately positioned by centering pins 54, to which the circuit board has corresponding holes, before the soldering operation. Such centering pins are also helpful in the embodiments according to FIGS. 6 and 7. For better compensation of tolerances, terminal elements 53 are in a floating mount in the direction of insertion of centering pins 54 in the SGA design according to FIG. 6 or a BGA design. Through an appropriate design of the terminal elements and the socket insert, the latter can be pressed onto the circuit board using the socket frame or another tool after the soldering operation. The contact elements may also be secured in a frictionally engaged manner in their end position in the socket insert, e.g., by a clamping action. Then tensile forces no longer act on the soldered connections.

A hermetically sealed "island" with respect to electromagnetic or electrostatic influences is formed by the shielding housing of the socket and possibly by a ground layer in the circuit board, with this island optionally being fixedly tied into a ground concept or coupled inductively or capacitively, so additional components such as quartz crystals, VCO circuit or clock circuit which are critical with regard to electromagnetic shielding can be integrated into the shielding housing with a modified shaping with an enlarged interior of the socket or in clearance 55 inside socket insert 7. This is especially favorable with components that are functionally assigned to the integrated circuit.

To prevent excessive pulling forces in removing integrated circuit 1, socket inserts designed in a zero insertion force (ZIF) version or a low insertion force (LIF) version on the integrated circuit side may be used.

In an advantageous manner, the socket can be used for integrated circuits of different housing designs and different electric terminal elements by only replacing socket insert 7.

What is claimed is:

1. A socket for an integrated circuit for assembly on a circuit board, comprising:

a socket insert through which electric connections between terminal elements of the integrated circuit and the circuit board are established, the socket insert having a peripheral rim; and a shielding housing open on a side facing the circuit board, the shielding housing including a socket frame and a cover, the shielding housing for accommodating the integrated circuit and the socket insert, the cover being a heat sink and including cooling ribs for cooling the integrated circuit, the cover opening for removal of the integrated circuit, the socket frame being attachable to the circuit board and having a peripheral ridge on an inside of the socket frame to secure the socket insert in a position, the socket frame having chambers to receive heat transfer paste on contact surfaces of the cover to provide thermal coupling between the socket frame and the cover, wherein, in a mounted stated, a lower side of the ridge is in contact with a top of the peripheral rim of the socket insert.

2. The socket according to claim 1, further comprising: screws for securing the socket frame on the circuit board.

3. The socket according to claim 1, wherein the socket frame has at least one chamfer on the inside of the socket frame to provide access for a lifting tool for lifting the integrated circuit.

4. The socket according to claim 1, wherein the socket frame includes parts, the parts extending in a straight line and together forming a rectangle, the parts overlapping one another at points of contact in an area of corners of the rectangle.

5. The socket according to claim 1, wherein the socket frame and the cover overlap at points of contact.

6. A socket for an integrated circuit for assembly on a circuit board, comprising:

a socket insert through which electric connections between terminal elements of the integrated circuit and the circuit board are established, the socket insert having a peripheral rim;

a shielding housing open on a side facing the circuit board, the shielding housing including a socket frame and a cover, the shielding housing for accommodating the integrated circuit and the socket insert, the cover opening for removal of the integrated circuit, the socket frame being attachable to the circuit board and having a peripheral ridge on an inside of the socket frame to secure the socket insert in a position, wherein, in a mounted stated, a lower side of the ridge is in contact with a top of the peripheral rim of the socket insert; and a bottom plate for assembly on a side of the circuit board opposite the socket frame and the cover.

7. The socket according to claim 6, wherein the bottom plate is a heat sink and includes cooling ribs, wherein, in the mounted state, the bottom plate is thermal coupled to the integrated circuit through one of the socket frame and the cover via recesses in the circuit board.

8. The socket according to claim 6, wherein the circuit board is clamped between the socket frame and the bottom plate.

9. The socket according to claim 8, wherein the socket frame and the bottom plate are screwed together using screws passing through the circuit board.

10. The socket according to claim 6, wherein the socket insert includes terminal elements for projecting through the circuit board, and the bottom plate has a recess to receive the terminal elements of the socket insert.

\* \* \* \* \*